United States Patent
Han

(10) Patent No.: US 10,622,433 B2
(45) Date of Patent: Apr. 14, 2020

(54) DISPLAY SUBSTRATE, METHOD FOR FORMING DISPLAY SUBSTRATE AND DISPLAY DEVICE

(71) Applicant: BOE TECHNOLOGY GROUP CO., LTD., Beijing (CN)

(72) Inventor: Long Han, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 1 day.

(21) Appl. No.: 16/023,522

(22) Filed: Jun. 29, 2018

(65) Prior Publication Data
US 2019/0189730 A1    Jun. 20, 2019

(30) Foreign Application Priority Data
Dec. 15, 2017    (CN) .......................... 2017 1 1350656

(51) Int. Cl.
*H01L 27/32* (2006.01)
*H01L 51/56* (2006.01)
*H01L 51/52* (2006.01)

(52) U.S. Cl.
CPC ........... *H01L 27/3276* (2013.01); *H01L 51/56* (2013.01); *H01L 27/3258* (2013.01); *H01L 51/5253* (2013.01); *H01L 2227/323* (2013.01); *H01L 2251/303* (2013.01); *H01L 2251/558* (2013.01)

(58) Field of Classification Search
CPC .............. H01L 27/3244; H01L 27/3258; H01L 27/3276; H01L 27/3288; H01L 27/3297; H01L 51/5253
See application file for complete search history.

(56) References Cited

U.S. PATENT DOCUMENTS

2014/0022479 A1*    1/2014    Hosaka ............. G02F 1/133512
349/43

* cited by examiner

*Primary Examiner* — Hoai V Pham
(74) *Attorney, Agent, or Firm* — Brooks Kushman P.C.

(57) ABSTRACT

A display substrate, a method for forming a display substrate and a display device are provided. The display substrate includes: a display region and a non-display region around the display region, where the non-display region of the display substrate includes: a gate driving circuit and a signal line on a base substrate, where the gate driving circuit is electrically insulated from the signal line, and an orthographic projection of the gate driving circuit onto the base substrate at least partially overlaps with an orthographic projection of the signal line onto the base substrate.

14 Claims, 2 Drawing Sheets

DISPLAY SUBSTRATE, METHOD FOR FORMING DISPLAY SUBSTRATE AND DISPLAY DEVICE

CROSS-REFERENCE TO RELATED APPLICATION

This application claims priority to Chinese Patent Application No. 201711350656.6 filed on Dec. 15, 2017, which is incorporated herein by reference in its entirety.

TECHNICAL FIELD

The present disclosure relates to the field of display product, in particular to a display substrate, a method for forming a display substrate and a display device.

BACKGROUND

The introduction of narrow bezel technology to increase the screen-to-body ratio of display products is an important trend of the current display products.

In the related art, the non-display region (i.e., the bezel region) of the display device is mainly used for arranging the gate driving circuit and the signal buses of certain electrodes. In addition, the packaging structure of some display devices also occupies the bezel region, so the non-display region of the display device in the related art is designed to have a minimum limit width of about 0.6 mm to 0.7 mm, which cannot meet the narrow bezel requirements of the display products.

In view of this, there is a need for a technical solution to reduce the display product bezel region.

SUMMARY

A display device is provided in the present disclosure, including a display region and a non-display region around the display region, where the non-display region of the display substrate includes: a gate driving circuit and a signal line on a base substrate, where the gate driving circuit is electrically insulated from the signal line, and an orthographic projection of the gate driving circuit onto the base substrate at least partially overlaps with an orthographic projection of the signal line onto the base substrate.

Optionally, the orthographic projection of the signal line onto the base substrate is within the orthographic projection of the gate driving circuit onto the base substrate.

Optionally, the signal line is a cathode signal line.

Optionally, an insulation layer is arranged between the gate driving circuit and the signal line, and the insulation layer is made of at least one of an organic material and an inorganic material.

Optionally, the insulation layer includes a first pattern layer made of the inorganic material and a second pattern layer made of the organic material, and the first pattern layer and the second pattern layer are arranged in a stacked manner.

Optionally, the inorganic material includes silicon dioxide.

Optionally, a thickness of the insulation layer is larger than or equal to 3000 angstroms.

Optionally, an interval between the display region of the base substrate and an edge of the base substrate is smaller than or equal to 0.5 mm.

Optionally, the gate driving circuit is at a side of the signal line away from the base substrate.

Optionally, the signal line is at a side of the gate driving circuit away from the base substrate.

Optionally, the display substrate further includes a packaging structure including an inorganic material layer and an organic material layer arranged in a stacked manner.

Optionally, the inorganic material layer is arranged at a side of the organic material layer away from the base substrate, and the inorganic material layer covers the organic material layer.

A method for forming a display substrate is further provided in the present disclosure, including: providing a base substrate; forming in sequence a gate driving circuit and a signal line at a non-display region of the base substrate, where the gate driving circuit is electrically insulated from the signal line, and an orthographic projection of the gate driving circuit onto the base substrate at least partially overlaps with an orthographic projection of the signal line onto the base substrate.

A display device is further provided in the present disclosure, including the above display substrate.

DETAILED DESCRIPTION

The present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

In the embodiments of the present disclosure, it should be understood that the serial numbers of the following processes does not mean the order of the execution order, and the order of execution of each process should be determined by its function and internal logic, rather than to limit the present disclosure.

In the related art, the internal structure of the display device such as a mobile phone includes, from the outside to the inside, the visible region (VA) and the active display region (AA), and a black border, i.e., the black matrix (BM) region, is between VA and AA. The implementation of a full screen requires that the width of the BM region is minimized, so that a narrow bezel can be achieved to increase the screen-to-body ratio.

The BM region border region is mainly provided with a gate drive circuit (GOA), a VSS signal bus (i.e., a cathode signal line), a TFE packaging structure, and a screen metal bezel. The gate driving circuit and the VSS signal bus are BP circuit designs of the Array process. Because of the gate drive circuit and the VSS signal bus are both made of metal layers and placed in a side-by-side manner, thus greatly occupying the space of the bezel.

In view of this, the present disclosure is to solve the technical issue that the relatively bezel size of the display device reduces the screen-to-body ratio of the display device.

Figure 1:
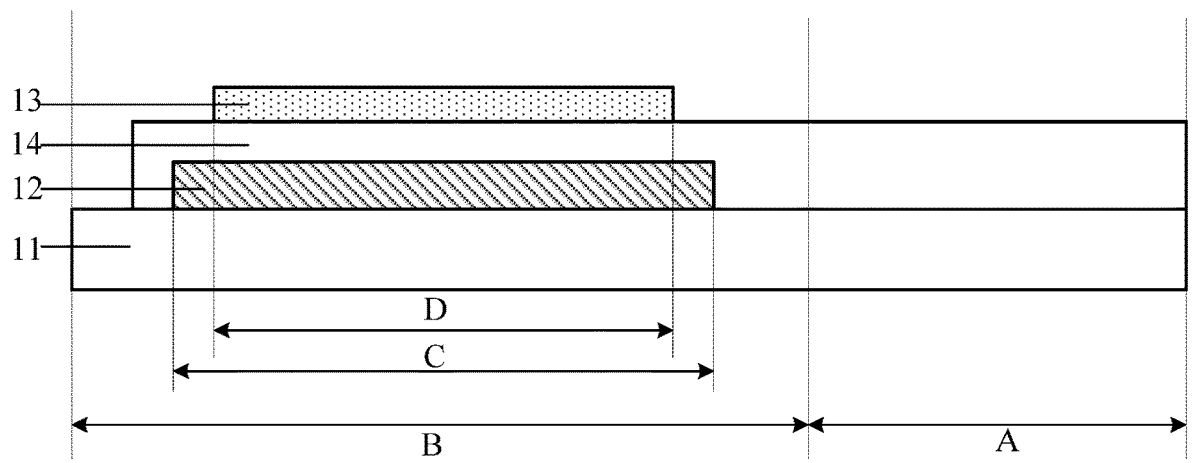
FIG. 1 is a schematic view of a display substrate in some embodiments of the present disclosure.

A display device is provided in some embodiments of the present disclosure, as shown in FIG. 1, including a display region A and a non-display region B (i.e., the bezel region) around the display region A.

In some embodiments of the present disclosure, the non-display region B includes a gate driving circuit 12 and a signal line 13 on a base substrate 11, where the gate driving circuit 12 is electrically insulated from the signal line 13, and an orthographic projection C of the gate driving circuit 12 onto the base substrate 11 at least partially overlaps with an orthographic projection D of the signal line 13 onto the base substrate 11.

According to the display substrate in some embodiments of the present disclosure, the gate driving circuit and signal line located in the non-display region of the display substrate are stacked, thereby reducing the area occupied by the gate driving circuit and signal line at the non-display region, freeing up more spaces for the display region. When the display substrate is applied to a display device, the screen-to-body ratio of the display device may be increased, so that the user may obtain better viewing effects.

Of course, in some embodiments of the present disclosure, the gate driving circuit 12 may be located above the pattern layer of the signal line 13. In addition, the gate driving circuit 12 and the signal trace 13 may partially overlap.

Optionally, the orthographic projection D of the signal line 13 onto the base substrate 11 completely falls within the orthographic projection C of the gate drive circuit 12 onto the base substrate 11. That is, the signal line 13 may not occupy the non-display region, thereby reducing the area of the non-display region.

In some embodiments of the present disclosure, the display substrate further includes an insulation layer 14 arranged between the gate driving circuit 12 and the signal line 13 which electrically insulating the gate driving circuit 12 from the signal line 13, so as to prevent the signal interference there between.

In some embodiments of the present disclosure, the insulation layer 14 may be made of an inorganic material or an organic material, or made of an inorganic material and an organic material.

For example, the insulation layer 14 is formed of an inorganic material, and the inorganic material may include silicon dioxide.

For example, the insulation layer 14 is made of an inorganic material and an organic material. The insulation layer 14 includes at least a first pattern layer 141 made of the inorganic material and a second pattern layer 142 made of the organic material, and the first pattern layer 141 and the second pattern layer 142 are arranged in a stacked manner.

In a practical application, there may be more than one first pattern layer 141 and/or the second pattern layer 142.

Optionally, the first pattern layers 141 and the second pattern layers 142 are arranged alternately and in a stacked manner.

Figure 3:
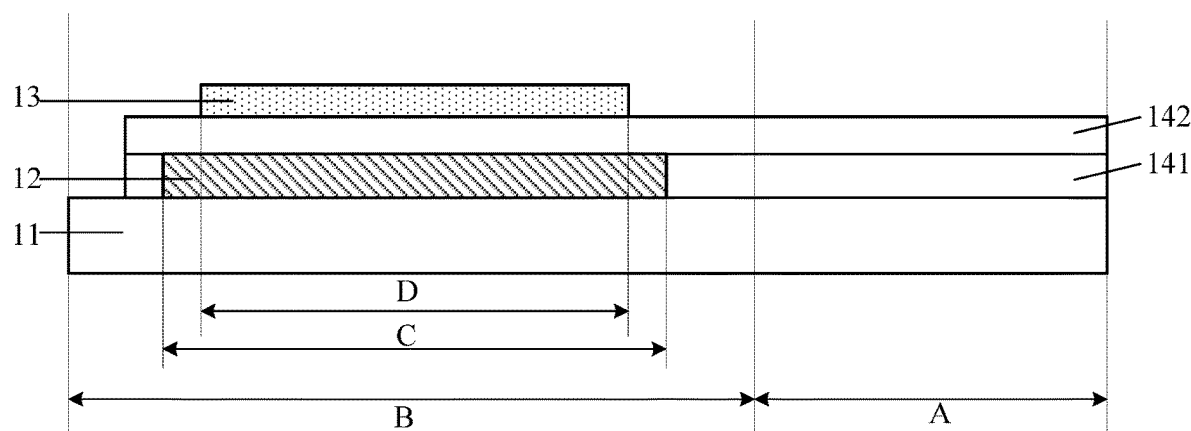
FIG. 3 is a schematic view of a display substrate in some embodiments of the present disclosure.

In some embodiments of the present disclosure, the arrangement of the first pattern layer 141 and the second pattern layer 142 is shown as FIG. 3, and the second pattern layer 142 is arranged at a side of the first pattern layer 141 away from the base substrate 21.

Optionally, in order to enable the insulation layer 14 to effectively shield the signal interference between the gate driving circuit 12 and the signal line 13, the thickness of the insulation layer 14 may be greater than or equal to 3000 angstroms.

It should be noted that, in some embodiments of the present disclosure, the gate driving circuit 12 and the signal line 13 are not limited to only be provided with the insulation layer 14 there between. The detailed description thereof will be given below.

Figure 2:
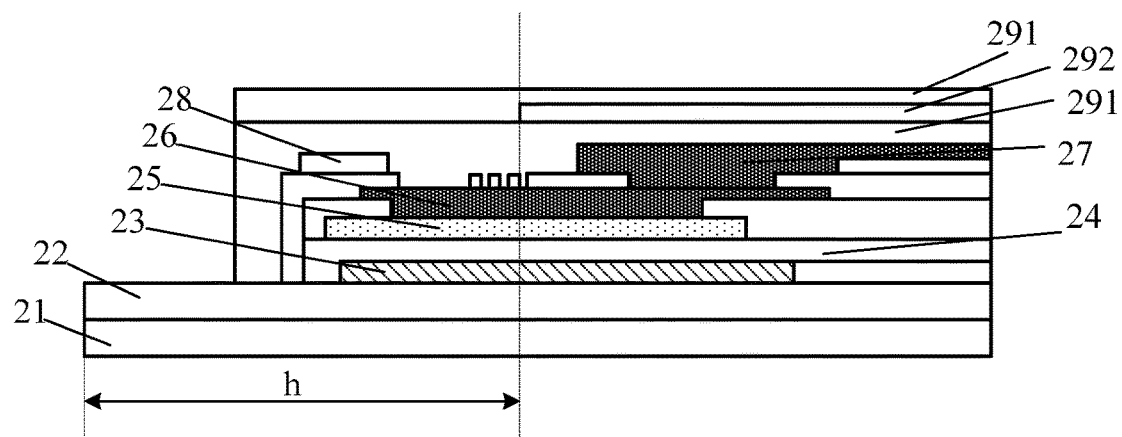
FIG. 2 is a schematic view of a display substrate in some embodiments of the present disclosure.

In some embodiments of the present disclosure, the signal line 13 is a cathode signal line. As shown in FIG. 2, at the non-display region, the display substrate includes:

a base substrate 21;

an interlayer dielectric 22 is formed on the base substrate 21, where the interlayer dielectric 22 serves as a base material and be made of a borophosphosilicate glass (BPSG), a phosphosilicate glass (PSG), polymer materials), silicon nitride and aerogel;

a gate drive circuit 23 formed on the interlayer dielectric 22;

the insulation layer 24 covering the gate driving circuit 23, where the insulation layer 24 may be a plan layer structure;

an anode signal line 25 formed on the insulation layer 24, where the anode signal line 25 is a titanium/aluminum/titanium composite structure and insulated from the gate driving circuit 23 by the insulation layer 24;

an anode pattern 26 coupled to the anode signal line 25, configured to load a drive signal on the anode signal line 25;

a cathode pattern 27 formed above the anode pattern 26;

a spacer 28 serving as a supporting structure and being made of a photosensitive resin material; and a packaging structure 29 configured to package the display substrate and to block water and oxygen, where the packaging structure 29 in an actual application is a composite layer structure, including an inorganic material layer, an organic material layer and an inorganic material layer which are sequentially stacked, the inorganic material layer is configured to isolate water and oxygen and has a certain heat resistance, and the organic material layer is configured to increase the overall flexibility of the packaging structure 29.

In some embodiments of the present disclosure, as shown in FIG. 1, the packaging structure 29 includes an inorganic material layer 291, an organic material layer 292 and an inorganic material layer 291 which are sequentially stacked. At least one inorganic material layer 291 is arranged at a side of the organic material layer 292 away from the base substrate 21, and at least one inorganic material layer 291 is covered by the organic material layer 292, so as to isolate water and oxygen.

It should be noted that, the signal line of the display substrate in the embodiments of the present disclosure is not limited to the cathode signal line, but any signal line arranged in the non-display region may be stacked on the gate driving circuit, so as to reduce the region occupied in the non-display region.

As shown in FIG. 2, in an actual application, an interval h between the display region of the base substrate 21 and an edge of the base substrate 21 is smaller than or equal to 0.5 mm.

According to the display substrate in some embodiments of the present disclosure, the non-display region of the display substrate is significantly reduced, and when the display substrate is applied to the display device, a high screen-to-body ratio of the display substrate may be achieved, which has a higher practical value for the user experience.

In addition, a display device including the above display substrate is further provided in some embodiments of the present disclosure. According to the display device in some embodiments of the present disclosure, the bezel region of the display device is effectively reduced, thereby achieving a higher screen-to-body ratio and improving the user's viewing experience.

In practical applications, the display device in the embodiments of the present disclosure may be a display product such as a mobile phone, a PDA, a television, a display, and the like.

Moreover, a method for forming the above display substrate is further provided in some embodiments of the present disclosure, including: providing a base substrate; forming in sequence a gate driving circuit and a signal line at a non-display region of the base substrate, where the gate driving circuit is electrically insulated from the signal line, and an orthographic projection of the gate driving circuit onto the base substrate at least partially overlaps with an orthographic projection of the signal line onto the base substrate.

To be specific, the method for forming the above display substrate in some embodiments of the present disclosure includes:

Step S1: providing a base substrate, where the base substrate may be a glass substrate or a quartz substrate;

Step S2: forming a gate driving circuit on the base substrate.

To be specific, in Step S2, a metal layer having a thickness of about 2000~4000 Å may be deposited by a magnetron sputtering, a thermal evaporation or other film forming methods. The metal layer may be Cu, Al, Ag, Mo, Cr, Nd, Ni, Mn, Ti, Ta, W or other metals and alloys of these metals. The metal layer may be a single layer structure or a multilayer structure, such as Cu\Mo, Ti\Cu\Ti, Mo\Al\Mo, and the like. Next, a layer of photoresist is coated onto the metal layer, and the photoresist is exposed through a mask plate, so as to form a photoresist-unreserved region and a photoresist-reserved region. The photoresist-reserved region corresponds to the region where the pattern of the gate driving circuit is located, and the photoresist-unreserved region corresponds to the region other than the above-mentioned patterns. Then, a developing process is performed, the photoresist in the photoresist-unreserved region is completely removed, and the thickness of the photoresist in the photoresist-reserved region is not changed. The metal layer of the photoresist-unreserved region is completely removed by an etching process, and then the remained photoresist is peeled off, so as to form a gate driving circuit.

Step S3: depositing an insulation layer covering the gate drive circuit;

To be Specific, in Step S3, an insulation layer having a thickness greater than 3000 angstroms may be deposited by a magnetron sputtering, a thermal evaporation, a PECVD or other film forming methods. The insulation layer may be made of an inorganic material and/or an organic material. The inorganic material may be SiNx. SiOx or Si(ON)x. Optionally, the inorganic material is SiO2. If the insulation layer is a composite of an inorganic material and an organic material, it may include a first pattern layer made of an inorganic material and a second pattern layer made of an organic material, and the first pattern layer and the second pattern layer may be arranged in a stacked manner.

Step S4: forming a signal line on the insulation layer, and an orthographic projection of the signal line onto the base substrate at least partially overlaps with an orthographic projection of the signal line onto the base substrate.

To be specific, in Step S4, a metal layer with a thickness of about 2000~4000 Å may be deposited by a magnetron sputtering, a thermal evaporation or other film forming methods, and the metal layer may be Mo. The metal layer may be a single layer structure or a multi-layer structure, and the multilayer structure may be Ti\Al\Ti or the like. Taking the signal line as the cathode signal line as an example, the structure is optionally Ti\Al\Ti. Next, a layer of photoresist is coated onto the metal layer, and the photoresist is exposed by a mask plate so as to form a photoresist-unreserved region and a photoresist-reserved region, where the photoresist-reserved region corresponds to the region where the pattern of the signal line is located, the photoresist-unreserved region corresponds to the region other than the above patterns. Then, a development processing is performed, the photoresist in the photoresist-unreserved region is completely removed, and the thickness of the photoresist in the photoresist-reserved region is not changed. The metal layer of the photoresist-unreserved region is completely removed by an etching process, and the remained photoresist is removed off, so as to form a signal line.

The above description is not to limit the scope of the present disclosure. For example, an interlayer dielectric may be formed on the base substrate before Step S2. In addition, in some embodiments of the present disclosure, a signal line may be formed first, and then an insulation layer and a gate driving circuit are sequentially formed, that is, the gate driving circuit is located above the signal line.

In addition, the method for forming a display substrate in some embodiments of the present disclosure may be used for forming an AMOLED display substrate. The signal line may be but not limited to a cathode signal line. After Step S4, an anode pattern and a cathode pattern may also be subsequently formed. Because the signal line are formed directly above the gate driver circuit in some embodiments of the present disclosure, the non-display region is effectively reduced, thereby reducing the occupying proportion of the bezel region.

The above are merely the preferred embodiments of the present disclosure. A person skilled in the art may make further modifications and improvements without departing from the principle of the present disclosure, and these modifications and improvements shall also fall within the scope of the present disclosure.

What is claimed is:

1. A display substrate, comprising a display region and a non-display region around the display region, wherein the non-display region of the display substrate comprises: a gate driving circuit and a signal line on a base substrate, wherein the gate driving circuit is electrically insulated from the signal line, and an orthographic projection of the gate driving circuit onto the base substrate at least partially overlaps with an orthographic projection of the signal line onto the base substrate.

2. The display substrate according to claim 1, wherein the orthographic projection of the signal line onto the base substrate is within the orthographic projection of the gate driving circuit onto the base substrate.

3. The display substrate according to claim 1, wherein the signal line is a cathode signal line.

4. The display substrate according to claim 1, wherein an insulation layer is arranged between the gate driving circuit and the signal line, and the insulation layer is made of at least one of an organic material and an inorganic material.

5. The display substrate according to claim 4, wherein the insulation layer comprises a first pattern layer made of the inorganic material and a second pattern layer made of the organic material, and the first pattern layer and the second pattern layer are arranged in a stacked manner.

6. The display substrate according to claim 4, wherein the inorganic material comprises silicon dioxide.

7. The display substrate according to claim 4, wherein a thickness of the insulation layer is larger than or equal to 3000 angstroms.

8. The display substrate according to claim 1, wherein an interval between the display region of the base substrate and an edge of the base substrate is smaller than or equal to 0.5 mm.

9. The display substrate according to claim 1, wherein the gate driving circuit is at a side of the signal line away from the base substrate.

10. The display substrate according to claim 1, wherein the signal line is at a side of the gate driving circuit away from the base substrate.

11. The display substrate according to claim 1, further comprising a packaging structure comprising an inorganic material layer and an organic material layer arranged in a stacked manner.

12. The display substrate according to claim 11, wherein the inorganic material layer is arranged at a side of the organic material layer away from the base substrate, and the inorganic material layer covers the organic material layer.

13. A display device comprising the display substrate according to claim 1.

14. A method for forming a display substrate, comprising:
   providing a base substrate;
   forming in sequence a gate driving circuit and a signal line at a non-display region of the base substrate, wherein the gate driving circuit is electrically insulated from the signal line, and an orthographic projection of the gate driving circuit onto the base substrate at least partially overlaps with an orthographic projection of the signal line onto the base substrate.

* * * * *